(12) United States Patent
Lv et al.

(10) Patent No.: US 9,581,865 B2
(45) Date of Patent: Feb. 28, 2017

(54) ARRAY SUBSTRATE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Kui Lv, Beijing (CN); Wenjin Fan, Beijing (CN); Kang Xiang, Beijing (CN); Xinxia Zhang, Beijing (CN); Xiao Guo, Beijing (CN); Fengzhen Lv, Beijing (CN); Chen Wang, Beijing (CN)

(73) Assignees: BOE TECHNOLOGY GROUP CO., LTD. (CN); HEFEI XINSHENG OPTOELECTRONICS TECHNOLOGY CO., LTD. (CN)

( * ) Notice: Subject to any disclaimer, the term of this patent is extended or adjusted under 35 U.S.C. 154(b) by 117 days.

(21) Appl. No.: 14/496,003

(22) Filed: Sep. 25, 2014

(65) Prior Publication Data
US 2015/0370103 A1    Dec. 24, 2015

(30) Foreign Application Priority Data

Jun. 19, 2014    (CN) .......................... 2014 1 0277111

(51) Int. Cl.
*G02F 1/1339* (2006.01)
*G02F 1/1341* (2006.01)
(Continued)

(52) U.S. Cl.
CPC ............. *G02F 1/1339* (2013.01); *C23C 16/44* (2013.01); *G02F 1/1341* (2013.01);
(Continued)

(58) Field of Classification Search
CPC  G02F 1/1339; G02F 1/1341; G02F 2201/086; G02F 2202/023; G02F 1/136286; G02F 2001/13629; Y10T 428/24777; C23C 16/44
(Continued)

(56) References Cited

U.S. PATENT DOCUMENTS

2002/0122143 A1* 9/2002 Woo ...................... G02F 1/1339
349/42
2011/0285944 A1* 11/2011 Park ...................... G02F 1/1345
349/110
2012/0314148 A1* 12/2012 Yamaguchi ......... H01L 51/5246
349/42

FOREIGN PATENT DOCUMENTS

CN         1713056 A       12/2005
CN       101661810 A  *    3/2010
(Continued)

OTHER PUBLICATIONS

Y. Yuan, "Preparation and Characterization of UV-Transparent conducting Ga2O3 Thin Films," Thesis Submitted to Zhejiang University, State Key Laboratory for Silicon Materials, Jul. 1, 2006.
(Continued)

*Primary Examiner* — Paul Lee
*Assistant Examiner* — Jia Pan
(74) *Attorney, Agent, or Firm* — BakerHostetler LLP

(57) ABSTRACT

The invention provides an array substrate and a display device, wherein the array substrate comprises a peripheral line in a frame region of the array substrate through which ultraviolet light is capable to pass.

7 Claims, 3 Drawing Sheets

(51) Int. Cl.
  *G02F 1/1362* (2006.01)
  *C23C 16/44* (2006.01)
(52) U.S. Cl.
  CPC .......... *G02F 1/136286* (2013.01); *G02F 2001/13629* (2013.01); *G02F 2201/086* (2013.01); *G02F 2202/023* (2013.01); *Y10T 428/24777* (2015.01)
(58) Field of Classification Search
  USPC ........................................ 349/153
  See application file for complete search history.

(56) References Cited

FOREIGN PATENT DOCUMENTS

| CN | 101841003 A | 9/2010 |
|---|---|---|
| CN | 102890351 A | 1/2013 |
| CN | 103003391 A | 3/2013 |

OTHER PUBLICATIONS

Office Action in Chinese Patent Application No. 201410277111.7, dated Apr. 18, 2106.
Office Action in Chinese Patent Application No. 201410277111.7, dated Sep. 18, 2016.

\* cited by examiner

ARRAY SUBSTRATE AND DISPLAY DEVICE

CROSS-REFERENCE TO RELATED APPLICATIONS

This application claims priority from Chinese Patent Application No. 201410277111.7, filed Jun. 19, 2014, which is also hereby incorporated herein by reference.

TECHNICAL FIELD

The present invention relates to the field of display technologies, and in particular, to an array substrate and a display device.

BACKGROUND

The forming process of a liquid crystal cell of a liquid crystal display device comprises: forming a box-shaped sealant on the four sides of a color filter substrate, wherein the sealant has an opening for the subsequent injection of a liquid crystal; fixing the array substrate and the color filter substrate together correspondingly by a sealant; injecting a liquid crystal through the opening of the sealant; sealing the opening by the sealant; and curing the sealant to strengthen the bond strength and sealing between the array substrate and the color filter substrate, thereby completing the manufacture of the liquid crystal cell.

Wherein, the curing of the sealant generally comprises two processes, i.e., ultraviolet curing (UV Cure) and heat curing (Heat Cure). As the name implies, the ultraviolet curing refers to a process in which a sealant is cured by irradiating via ultraviolet light.

With demanding and developing of narrow frame technologies, the sealant overlaps with a black matrix on the color filter substrate, thus the ultraviolet curing can only be performed on the side of the array substrate. However, during practical application, it is found that sealing effect of the liquid crystal cell manufactured by the ultraviolet curing on the side of the array substrate is not ideal. The periphery liquid crystal of display device will be contaminated, and image sticking on the periphery of display device will be caused.

SUMMARY

The invention provides an array substrate and a display device. A liquid crystal cell in the array substrate and the display device has improved a sealing effect, so that it may be improved that image sticking on the periphery of display device caused by contamination of the peripheral liquid crystal due to the poor sealing effect.

To attain the above objects, the invention employs the following technical solutions.

The invention provides an array substrate, comprising a peripheral line in a frame region of the array substrate through which ultraviolet light is capable to pass.

In the invention, the peripheral line is formed of material through which ultraviolet light are capable to pass.

In the invention, the peripheral line is formed of at least one selected from a gallium peroxide film, a film formed by stacking gallium peroxide, aluminum and gallium peroxide in turn, a film formed by stacking gallium peroxide and tin in turn, a zinc oxide-based film and a zinc oxide-based film containing aluminum.

in the invention, when the wavelength range of the ultraviolet light is 320 nm~400 nm, the peripheral line is formed of at least one selected from the gallium peroxide film, the film formed by stacking gallium peroxide, aluminum and gallium peroxide in turn, the film formed by stacking gallium peroxide and tin in turn and the zinc oxide-based film.

In the invention, when the peripheral line is formed of the film formed by stacking gallium peroxide, aluminum and gallium peroxide in turn, the gallium peroxide layer formed firstly has a thickness of 20 µm~55 µm, the aluminum layer has a thickness of 10 µm~20 µm, and the gallium peroxide layer formed subsequently has a the thickness of 30 µm~40 µm.

In the invention, the gallium peroxide layer formed firstly has a thickness of 26 µm, 34 µm, 42 µm or 50 µm, the aluminum layer has a thickness of 15 µm, and the gallium peroxide layer formed subsequently has a thickness of 34 µm.

In the invention, when the wavelength of the ultraviolet light is greater than 400 nm, the peripheral line is formed of a zinc oxide-based film containing aluminum.

In the invention, a process for forming the peripheral line comprises chemical vapor deposition.

The invention further provides a display device, which comprises any one of the above array substrates.

In the invention, the display device further comprises: a color filter substrate having a black matrix, the color filter being arranged oppositely to the array substrate, a liquid crystal between the array substrate and the color filter substrate, and a sealant for sealing the liquid crystal, the sealant overlapping with the black matrix partially.

In the array substrate and the display device according to the invention, ultraviolet light is capable to pass through the peripheral line on the array substrate, so that when a sealant is cured by the ultraviolet light from the side of the array substrate, the ultraviolet light can pass through the peripheral line and act on the sealant under the peripheral line. In this way, the sealant under the peripheral line may be effectively cured and the problem of incomplete curing caused by that the sealant is shielded by the peripheral line through which ultraviolet light is not capable to pass may be avoided, and therefore the liquid crystal will not be contaminated due to the incomplete curing of the sealant. The sealing effect of the liquid crystal display device may be improved and the problem of image sticking on the peripheral line during displaying may be eliminated.

BRIEF DESCRIPTION OF THE DRAWINGS

In order to more clearly illustrate the technical solutions of the embodiments of the invention or the prior art, the drawings required in the description of the embodiments or the prior art will be briefly introduced below. Apparently, the drawings in the description below only show some embodiments of the invention, and other drawings may also be obtained by one of ordinary skills in the art based on these drawings without creative work.

DETAILED DESCRIPTION

Figure 1:
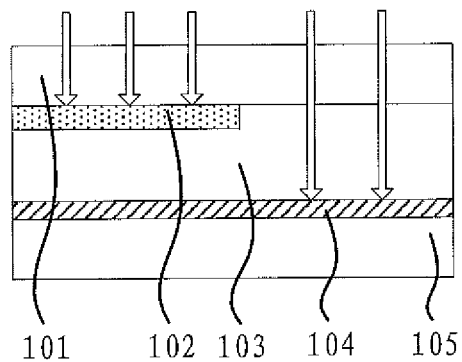
FIG. 1 is a schematic diagram showing a sealant ultraviolet curing process of a liquid crystal cell in the prior art.
Figure 2:
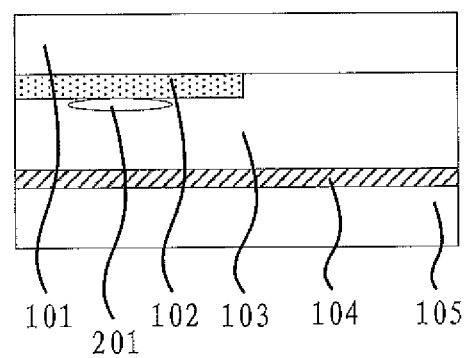
FIG. 2 is a schematic diagram showing a sealant of the liquid crystal cell after heat curing in the prior art.

As described in the background technology, in the prior art, the sealing effect of a liquid crystal cell is poor because the sealant is cured by ultraviolet from the side of the array substrate, which causes contamination of the liquid crystal on the periphery of the liquid crystal cell and image sticking on the peripheral line during displaying. The inventors find by research that, the main reason for the above problem is as the following (as shown in FIG. 1, it is a sectional view of the peripheral part of a liquid crystal cell). An array substrate 101 of the liquid crystal cell has a line 102 on its periphery, a black matrix 104 is provided on a color filter substrate 105, and the array substrate 101 and the color filter substrate 105 are bound by a sealant 103. Due to the demand for a device having a narrow frame, the black matrix 104 overlaps with the sealant 103 and the ultraviolet light is not capable to pass through the black matrix 104, and thus it is required that the sealant 103 is cured by the ultraviolet light from the side of the array substrate 101. However, the ultraviolet light is not capable to pass through the periphery line 102 (generally, a stacked layer of aluminum and molybdenum) on the array substrate 101, so that the part of the sealant 103 under the periphery line 102 will be masked, and thereby the part of sealant 103 under the periphery line 102 cannot be effectively cured. After the subsequent heat curing, the part of sealant 103 under the periphery line 102, which is not effectively cured, will be detached. The detachment 201 is as shown in FIG. 2. On one hand, this will cause the leakage of the liquid crystal. On the other hand, components of the sealant 103 that is not fully cured may easily permeate into the liquid crystal, and impurities in the air such as vapor, dust and static electricity may easily permeate into the liquid crystal through the detachment 201 of the above sealant 103 during the subsequent manufacture process or application process of the display device. Therefore, the periphery liquid crystal of the liquid crystal cell will be contaminated, and the image sticking on the peripheral line during displaying is caused, so that picture quality will be degraded severely.

In view of this, one embodiment of the invention provides an array substrate, which comprises a peripheral line in a frame region of the array substrate through which ultraviolet light is capable to pass.

In the embodiment of the invention, the ultraviolet light is capable to pass through the peripheral line on the array substrate, so that when a sealant is cured by the ultraviolet light from the side of the array substrate, the ultraviolet light can pass through the peripheral line and act on the sealant under the peripheral line. In this way, the sealant under the peripheral line may be effectively cured and the problem of incomplete curing caused by that the sealant is shielded by the peripheral line through which ultraviolet light is not capable to pass may be avoided, and therefore the liquid crystal will not be contaminated due to the incomplete curing of the sealant. The sealing effect of the liquid crystal display device may be improved and the problem of image sticking on the peripheral line during displaying may be eliminated.

The above shows core concept of the invention. In order to make the above objects, characteristics and advantages of the invention more apparent, the technical solutions of the embodiments of the invention will be described below clearly and fully in conjunction with the drawings in the embodiments of the invention. Apparently, the embodiments described only show a part of the embodiments of the invention, rather than being the whole embodiments. All other embodiments made by one of ordinary skills in the art based on the embodiments in the invention without creative work pertain to the protection scope of the invention.

Figure 3:
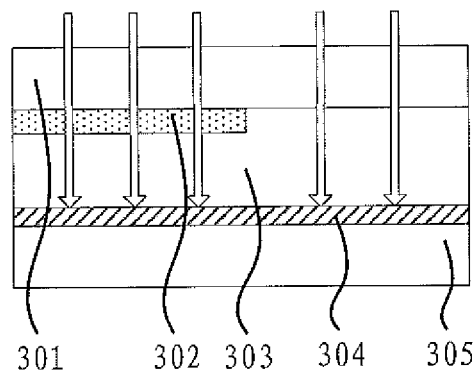
FIG. 3 is a schematic diagram showing a sealant ultraviolet curing process of a liquid crystal cell according to one embodiment of the invention.

One embodiment of the invention provides an array substrate. As shown in FIG. 3, it is a sectional view showing an edge of a display device according to this embodiment. Wherein, 301 represents an array substrate, and the array substrate 301 may be divided into a pixel region and a frame region, the pixel region corresponds to the main display region of a display device, and the frame region surrounds the pixel region and corresponds to the frame of the display device.

A peripheral line 302 is formed in the frame region of the array substrate 301, and the peripheral line 302 is located at the edge of the array substrate 301 and is used for connecting elements in the pixel region, for example, a thin-film transistor, a pixel electrode, a gate line and a data line, etc., with an external control chip. The ultraviolet light is capable to pass through the peripheral line 302.

As shown in FIG. 3, because the ultraviolet light is capable to pass through the peripheral line 302, when the array substrate 301 and the color filter substrate 305 are aligned and bound with a sealant 303 and then the sealant 303 is cured, the incident ultraviolet light from the side of the array substrate 301 (i.e., the side of the peripheral line 302 that faces the color filter substrate 305) can pass through the peripheral line 302 and act on a part of the sealant 302 under the peripheral line 302, so that the part of sealant 302 will be fully cured (see FIG. 4), and the sealing effect will be improved. Thus, after a subsequent manufacture process such as heat curing, the part of the sealant under the peripheral line 302 will be firmly bound to the array substrate 301 and it will not be detached, so that the impurities in the external environment, such as dust and static electricity, etc., will be well kept out. At the same time, the phenomenon that the part of the sealant which is not fully cured permeates into and contaminates the liquid crystal will not appear. Therefore, the problem of image sticking caused by contaminated liquid crystal due to the poor sealing effect will be eliminated.

In this embodiment, a specific mode for realizing a peripheral line 302 through which the ultraviolet light is not capable to pass is not specifically limited. Preferably, the peripheral line is formed of material through which ultraviolet light are capable to pass.

Specifically, the peripheral line 302 may be preferably formed of at least one selected from a gallium peroxide ($Ga_2O_3$) film, a film formed by stacking gallium peroxide, aluminum (Al) and gallium peroxide in turn, a film formed by stacking gallium peroxide and tin (Sn) in turn, a zinc oxide (ZnO)-based film and a zinc oxide-based film containing aluminum. That is, the peripheral line 302 may be formed of $Ga_2O_3$, $Ga_2O_3/Al/Ga_2O_3$ (aluminum-sandwiched gallium peroxide), $Ga_2O_3/Sn$ (stacked gallium peroxide and tin), a ZnO (zinc oxide)-based material and an Al-doped ZnO-based material.

During the manufacture process of a display device, the ultraviolet light typically used for curing the sealant 303 has a wavelength of 320 nm~400 nm. When the wavelength of the ultraviolet light is 320 nm~400 nm, the peripheral line 302 is preferably formed of at least one selected from a gallium peroxide film, a film formed by stacking gallium peroxide, aluminum and gallium peroxide in turn, a film formed by stacking gallium peroxide and tin in turn and a zinc oxide-based film.

In this embodiment, a thickness of the film for forming the peripheral line 302 is not limited, and it may be optimized and designed according to factors such as practical product requirement, the wavelength of the ultraviolet light used for curing and the material of the peripheral line 302, etc. Wherein, when the peripheral line 302 is formed of a film formed by stacking gallium peroxide, aluminum and gallium peroxide in turn, a thickness of the gallium peroxide layer formed firstly (i.e., the gallium peroxide layer far from the color filter substrate in the film) is preferably 20 µm~55 µm, a thickness of the aluminum layer is preferably 10 µm~20 µm, and a thickness of the gallium peroxide layer formed subsequently (i.e., the gallium peroxide layer close to the color filter substrate in the film) is preferably 30 µm-40 µm. More preferably, the thickness of the gallium peroxide layer formed firstly may be 26 µmm, 34 µm, 42 µm or 50 µm, the thickness of the aluminum layer is 15 µm, and the thickness of the gallium peroxide layer formed subsequently is 34 µm.

When the peripheral line 302 is formed of a zinc oxide-based film, the zinc oxide-based material may specifically be an $Mg_xZn_{1-x}O$-based material, wherein, x may be equal to 0.03~0.45 so as to realize a high transmittance for ultraviolet light.

In certain cases, the wavelength of the ultraviolet light required for curing may not be 320 nm~400 nm. When the wavelength of the ultraviolet light is greater than 400 nm, the peripheral line 302 may be preferably formed of a zinc oxide-based film containing aluminum. This is because that the ultraviolet light in the band from ultraviolet light to visible light (i.e., 380 nm~830 nm) can pass through the zinc oxide-based material, and the ultraviolet light in the far ultraviolet region (i.e., a wavelength is larger than 400 nm) can pass through the zinc oxide-based material containing aluminum obtained by addition of aluminum ion to the zinc oxide-based material. The transmittance for ultraviolet lights with different wavelengths may depend on aluminum ion content, thus the zinc oxide-based material containing aluminum may be used by changing the aluminum ion content with the waveband required by the ultraviolet light for curing the sealant.

In this embodiment, the peripheral line 302 may be formed by chemical vapor deposition (CVD) in conjunction with a photo etching process. The process for forming the peripheral line 302 may be as follows.

First of all, forming a film through which ultraviolet light is capable to pass on an array substrate using a material through which ultraviolet light is capable to pass.

Figure 5:
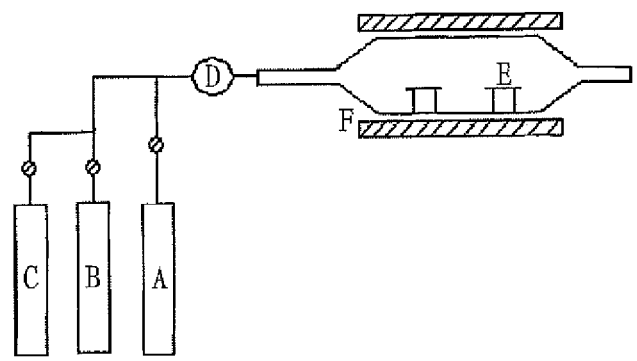
FIG. 5 is a procedure diagram showing a preparation of a peripheral line according to one embodiment of the invention.

For example, when the material through which ultraviolet light is capable to pass is gallium peroxide and the process for forming the film is CVD, as shown in FIG. 5. In FIG. 5, oxygen gas ($O_2$) is filled into a device A, a gallium source (gallium chloride+ethanol) is filled into a device B, and nitrogen gas ($N_2$) is filled into a device C. The process for forming the film comprises forming a gallium peroxide film through which ultraviolet light is capable to pass by the following steps: feeding raw materials and carrier gas into a mixing chamber D to mix well, making the mixture entering into a reaction furnace F to react with each other, and finally generating and depositing the gallium peroxide on an array substrate that is placed on a quartz support E, wherein gallium chloride ($GaCl_3$) and oxygen are taken as the raw materials, and nitrogen is taken as the carrier gas.

The temperature required for the above process for forming the film (i.e., the temperature for preparing a gallium peroxide peripheral line) may be set as required. It should be pointed out that, the gallium peroxide film formed at a temperature between 400° C.~800° C. (for example, 400° C., 500° C., 600° C. , 700° C., 800° C.) has a high transmittance for the ultraviolet light with a wavelength larger than 300 nm.

It should be noted that, for the peripheral line formed by other materials through which ultraviolet light is capable to pass, first of all, in the process of preparing the film through which ultraviolet light is capable to pass, parameters such as apparatus parameter, gas flow, gas pressure, gas concentration and reaction temperature, etc., may be adaptability adjusted according to different materials and different selected processes, and it will not be detailed one by one in this embodiment.

According to different requirements for the practical products, the process for forming the film may specifically comprises a deposition process such as common chemical vapor deposition, metal-organic chemical vapor deposition (MOCVD) and plasma enhanced chemical vapor deposition (PECVD), etc., or spray thermal decomposition, laser pulse deposition and coating film using molecular beam epitaxy, so as to adjust and control thickness and compactness of the film.

Next, after the film through which ultraviolet light is capable to pass has been prepared, an unwanted part of the film is removed by photoetching, the width of the line to be formed is adjusted and controlled, and a peripheral line 302 through which ultraviolet light is capable to pass is formed in the frame region of the array substrate.

Additionally, after the peripheral line 302 has been formed, the wiring precision can be preferably rectified by a laser rectification and ablation technology.

Figure 4:
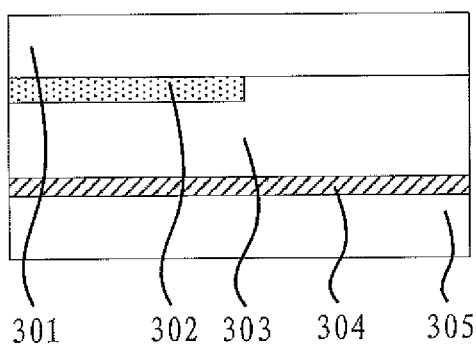
FIG. 4 is a schematic diagram showing a sealant of the liquid crystal cell after heat curing according to one embodiment of the invention.

This embodiment further provides a display device that comprises the array substrate according to this embodiment. As shown in FIG. 3 or FIG. 4, the display device further comprises: a color filter substrate 305 having a black matrix 304, the color filter substrate being arranged oppositely to the array substrate, a liquid crystal between the array substrate 301 and the color filter substrate 305; and a sealant 303 for sealing the liquid crystal, the sealant overlapping with the black matrix 304 partially.

In the above display device, because the sealant 303 overlaps with the black matrix, the sealant 303 cannot be cured by the ultraviolet light from the side of the color filter substrate 305. Instead, the sealant 303 can be cured by the ultraviolet light from the other side of the array substrate 301. A part of the ultraviolet light enters the liquid crystal cell from the gap between the peripheral lines 302 on the array substrate 301 and acts on the sealant 303, and the other part of the ultraviolet light passes through the peripheral line 302 through which ultraviolet light is capable to pass and reaches the part of the sealant 303 under the peripheral line 302, so that the whole sealant 303 may be effectively cured, and thereby the sealing effect of the liquid crystal cell may be improved, and the problem of image sticking on the periphery may be alleviated.

It should be noted that, preferably, the display device according to this embodiment is a liquid crystal display device with a narrow frame, in which a black matrix overlaps with the sealant; however, it should be understood by one skilled in the art based on the core concept of the invention that, the technical solutions of the invention may be applied to other display devices in which the sealant can be cured by the ultraviolet light from the side of the array substrate.

The above description only shows some preferred embodiments of the invention, rather than limiting the protection scope of the invention thereto. Any variations and substitutions made by one skilled in the art without departing from the technical scope of the invention should be contemplated by the protection scope of the invention. Therefore, the protection scope of the invention should be defined by the appended claims.

What is claimed is:

1. An array substrate, comprising a peripheral line in a frame region of the array substrate through which ultraviolet light is capable to pass, wherein the peripheral line is formed of a film formed by stacking gallium peroxide, aluminum and gallium peroxide in turn, wherein the gallium peroxide layer formed firstly has a thickness of 20 μm~55 μm, the aluminum layer has a thickness of 10 μm~20 μm, and the gallium peroxide layer formed subsequently has a thickness of 30 μm~40 μm.

2. The array substrate according to claim 1, wherein the gallium peroxide layer formed firstly has a thickness of 26 μm, 34 μm, 42 μm or 50 μm, the aluminum layer has a thickness of 15 μm, and the gallium peroxide layer formed subsequently has a thickness of 34 μm.

3. The array substrate according to claim 1, wherein a process for forming the peripheral line comprises chemical vapor deposition.

4. A display device, comprising an array substrate comprising a peripheral line in a frame region of the array substrate through which ultraviolet light is capable to pass, wherein the peripheral line is formed of a film formed by stacking gallium peroxide, aluminum and gallium peroxide in turn, wherein the gallium peroxide layer formed firstly has a thickness of 20 μm~55 μm, the aluminum layer has a thickness of 10 μm~20 μm, and the gallium peroxide layer formed subsequently has a thickness of 30 μm~40 μm.

5. The display device according to claim 4, further comprising:

a color filter substrate having a black matrix, the color filter substrate being arranged oppositely to the array substrate, a liquid crystal between the array substrate and the color filter substrate; and a sealant for sealing the liquid crystal, the sealant overlapping with the black matrix partially.

6. The display device according to claim 4, wherein the gallium peroxide layer formed firstly has a thickness of 26 μm, 34 μm, 42 μm or 50 μm, the aluminum layer has a thickness of 15 μm, and the gallium peroxide layer formed subsequently has a thickness of 34 μm.

7. The display device according to claim 4, wherein a process for forming the peripheral line comprises chemical vapor deposition.

* * * * *